United States Patent
Nickel

(10) Patent No.: US 6,885,049 B2
(45) Date of Patent: Apr. 26, 2005

(54) SPIN DEPENDENT TUNNELING JUNCTIONS INCLUDING FERROMAGNETIC LAYERS HAVING FLATTENED PEAKS

(75) Inventor: Janice Nickel, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/981,277

(22) Filed: Oct. 17, 2001

(65) Prior Publication Data
US 2002/0047145 A1 Apr. 25, 2002

Related U.S. Application Data

(62) Division of application No. 09/514,934, filed on Feb. 28, 2000.

(51) Int. Cl.[7] ............... H01L 29/76; H01L 29/94; H01L 31/062; H01L 31/113; H01L 31/119
(52) U.S. Cl. ............... 257/295; 257/421; 365/171; 365/158
(58) Field of Search ............... 257/295, 421; 365/171, 158, 170, 173, 55, 232, 157, 32, 33, 66

(56) References Cited

U.S. PATENT DOCUMENTS

| | | | | |
|---|---|---|---|---|
| 5,640,343 A | * | 6/1997 | Gallagher et al. | 365/171 |
| 5,650,958 A | * | 7/1997 | Gallagher et al. | 365/173 |
| 5,748,524 A | * | 5/1998 | Chen et al. | 365/173 |
| 5,768,183 A | * | 6/1998 | Zhu et al. | 365/171 |
| 5,774,394 A | * | 6/1998 | Chen et al. | 365/158 |
| 5,793,697 A | * | 8/1998 | Scheuerlein | 365/230.07 |
| 5,841,692 A | * | 11/1998 | Gallagher et al. | 365/173 |
| 5,898,612 A | * | 4/1999 | Chen et al. | 365/158 |
| 5,953,248 A | * | 9/1999 | Chen et al. | 365/158 |
| 5,966,012 A | * | 10/1999 | Parkin | 324/252 |
| 5,966,323 A | * | 10/1999 | Chen et al. | 365/158 |
| 5,976,713 A | * | 11/1999 | Fuke et al. | 428/692 |
| 5,986,858 A | * | 11/1999 | Sato et al. | 360/11 |
| 6,016,241 A | * | 1/2000 | Coffey et al. | 360/113 |
| 6,069,820 A | * | 5/2000 | Inomata et al. | 365/171 |
| 6,072,382 A | * | 6/2000 | Draughton et al. | 338/32 R |
| 6,110,751 A | * | 8/2000 | Sato et al. | 438/3 |
| 6,114,719 A | * | 9/2000 | Dill et al. | 257/295 |
| 6,166,948 A | * | 12/2000 | Parkin et al. | 365/173 |
| 6,183,859 B1 | * | 2/2001 | Chen et al. | 428/332 |
| 6,219,212 B1 | * | 4/2001 | Gill et al. | 360/324.2 |

FOREIGN PATENT DOCUMENTS

| | | | | |
|---|---|---|---|---|
| EP | 0929110 A1 | * | 1/1999 | H01L/43/08 |
| EP | 0936622 A2 | * | 1/1999 | G11C/11/15 |
| WO | WO 00/26918 | * | 5/2000 | G11C/11/16 |

* cited by examiner

*Primary Examiner*—Amir Zarabian
*Assistant Examiner*—Monica Lewis

(57) ABSTRACT

A spin dependent tunneling ("SDT") junction of a memory cell for a Magnetic Random Access Memory ("MRAM") device includes a pinned ferromagnetic layer, followed by an insulating tunnel barrier and a sense ferromagnetic layer. During fabrication of the MRAM device, after formation of the pinned layer but before formation of the insulating tunnel barrier, an exposed surface of the pinned layer is flattened. The exposed surface of the pinned layer may be flattened by an ion etching process.

7 Claims, 4 Drawing Sheets

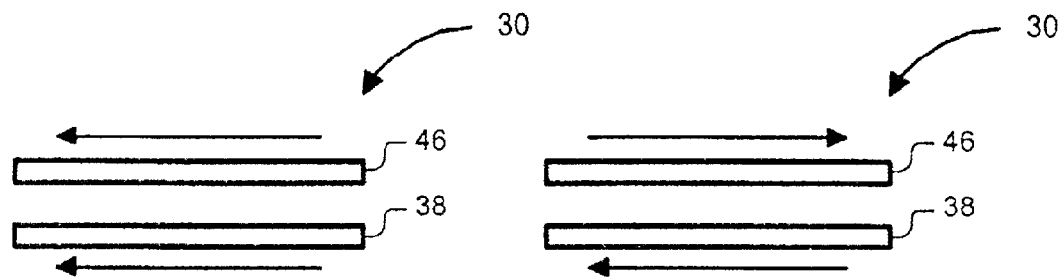
FIG. 3a  FIG. 3b
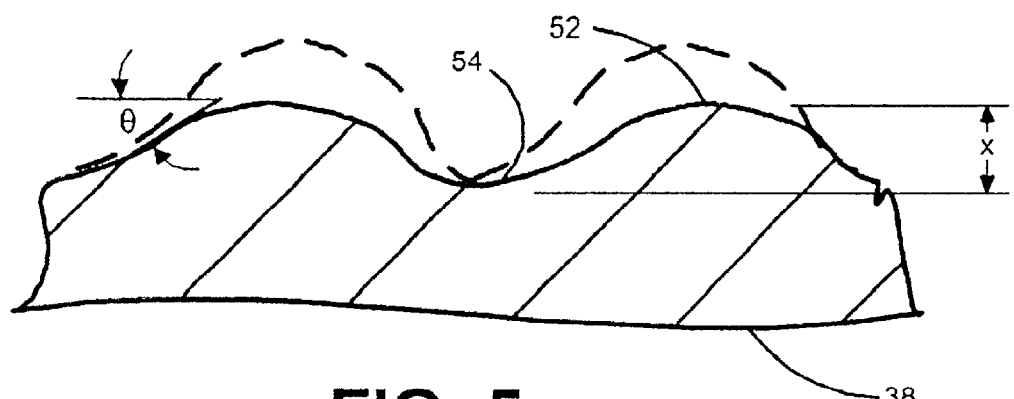
FIG. 5
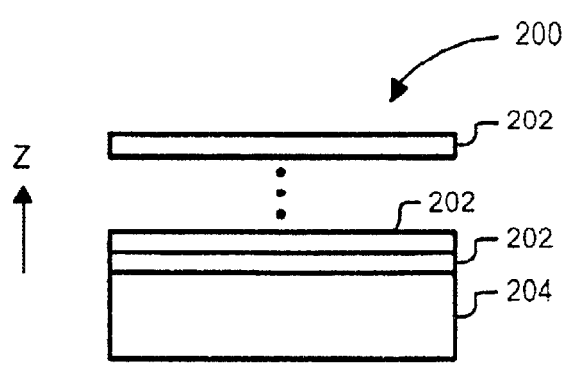
FIG. 7

SPIN DEPENDENT TUNNELING JUNCTIONS INCLUDING FERROMAGNETIC LAYERS HAVING FLATTENED PEAKS

CROSS REFERENCE TO RELATED APPLICATION

This is a divisional of copending application Ser. No. 09/514,934 filed on Feb. 8, 2000, which whereby incorporated by reference herein.

BACKGROUND OF THE INVENTION

The present invention relates to random access memory for data storage. More specifically, the present invention relates to a method of fabricating a magnetic random access memory device including an array of spin dependent tunneling junction memory cells.

Magnetic Random Access Memory ("MRAM") is a non-volatile memory that is being considered for long term data storage. A typical MRAM device includes an array of memory cells. Word lines extend along rows of the memory cells, and bit lines extend along columns of the memory cells. Each memory cell is located at a cross point of a word line and a bit line.

The memory cells may be spin dependent tunneling ("SDT") junctions. A typical SDT junction has a pinned ferromagnetic layer, a sense ferromagnetic layer and an insulating tunnel barrier sandwiched between the ferromagnetic layers. The SDT junction exhibits tunneling magnetoresistance ("TMR") in the presence of a magnetic field. Relative orientation and magnitude of spin polarization of the ferromagnetic layers determine the resistance of the SDT junction. Generally, resistance of the SDT junction is a first value R if the ferromagnetic layers have a "parallel" magnetization orientation, and the resistance is increased to a second value R+ΔR if the magnetization orientation is changed from parallel to anti-parallel.

These two magnetization orientations, parallel and anti-parallel, represent logic values of "0" and "1." The orientation may be changed from parallel to anti-parallel or vice-versa by applying the proper magnetic field to the SDT junction.

A logic value may be written to an SDT junction by setting the magnetization orientation to either parallel or anti-parallel. The logic value stored in the SDT junction may be read by sensing the resistance of the SDT junction.

Ideally, each memory cell retains its orientation of magnetization, even in the absence of external power. Therefore, ideal memory cells are non-volatile.

In practice, however, not all memory cells are ideal. In an MRAM memory device including thousands and thousands of SDT junction memory cells, certain SDT junctions will exhibit low resistance in a zero magnetic field. When a sufficient magnetic field is applied to such cells, they will switch from a low resistance to a high resistance. However, such cells will inadvertently switch back to the low resistance when the magnetic field is removed. Such SDT junctions are unusable.

Certain SDT junctions will switch from one magnetization orientation to the other in the presence of a sufficient magnetic field. However, these SDT junctions will not switch back in the presence of a magnetic field having equal magnitude but opposite polarity. Such SDT junctions can be unusable Some of the SDT junctions will be shorted. Shorted SDT junctions are also unusable.

Unusable SDT junctions reduce the storage capacity of MRAM devices. Large numbers of unusable SDT junctions result in the rejection of MRAM devices, and consequently, increase fabrication cost.

Resistance of the many SDT junctions across the device will not be uniform. Resistance of the SDT junctions might vary by as much as 30%. This makes it difficult for a read/write circuit to sense the change in resistance among multiple columns of memory cells. Consequently, complexity of the read/write circuit is increased in order to read the memory cells.

There is a need to improve the uniformity of resistance across MRAM devices. There is also a need to increase the usable number of SDT junctions in MRAM devices.

SUMMARY OF THE INVENTION

These needs are met by present invention. One aspect of the present invention is a method of fabricating a memory device including a plurality of magnetoresistive memory cells. The method includes the steps of forming a first ferromagnetic layer; flattening an exposed surface of the first layer; and forming a second ferromagnetic layer atop the first ferromagnetic layer such that the first and second ferromagnetic layers are ferromagnetically coupled. Flattening the exposed surface reduces the ferromagnetic coupling between the first and second ferromagnetic layers.

This method may be applied to MRAM devices including SDT junction memory cells. Steps for fabricating such MRAM devices include depositing a first ferromagnetic layer; and flattening an exposed surface of the first layer. The exposed surface is flattened prior to depositing other layers atop the first ferromagnetic layer.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 3a and 3b are illustrations of parallel and anti-parallel magnetization orientations in the ferromagnetic layers of the SDT junction;

FIG. 5 is an illustration of a peak-to-valley height difference on the upper surface of the bottom ferromagnetic layer of the SDT junction;

FIG. 7 is an illustration of a multi-level MRAM chip according to the present invention.

DETAILED DESCRIPTION OF THE INVENTION

Figure 1:
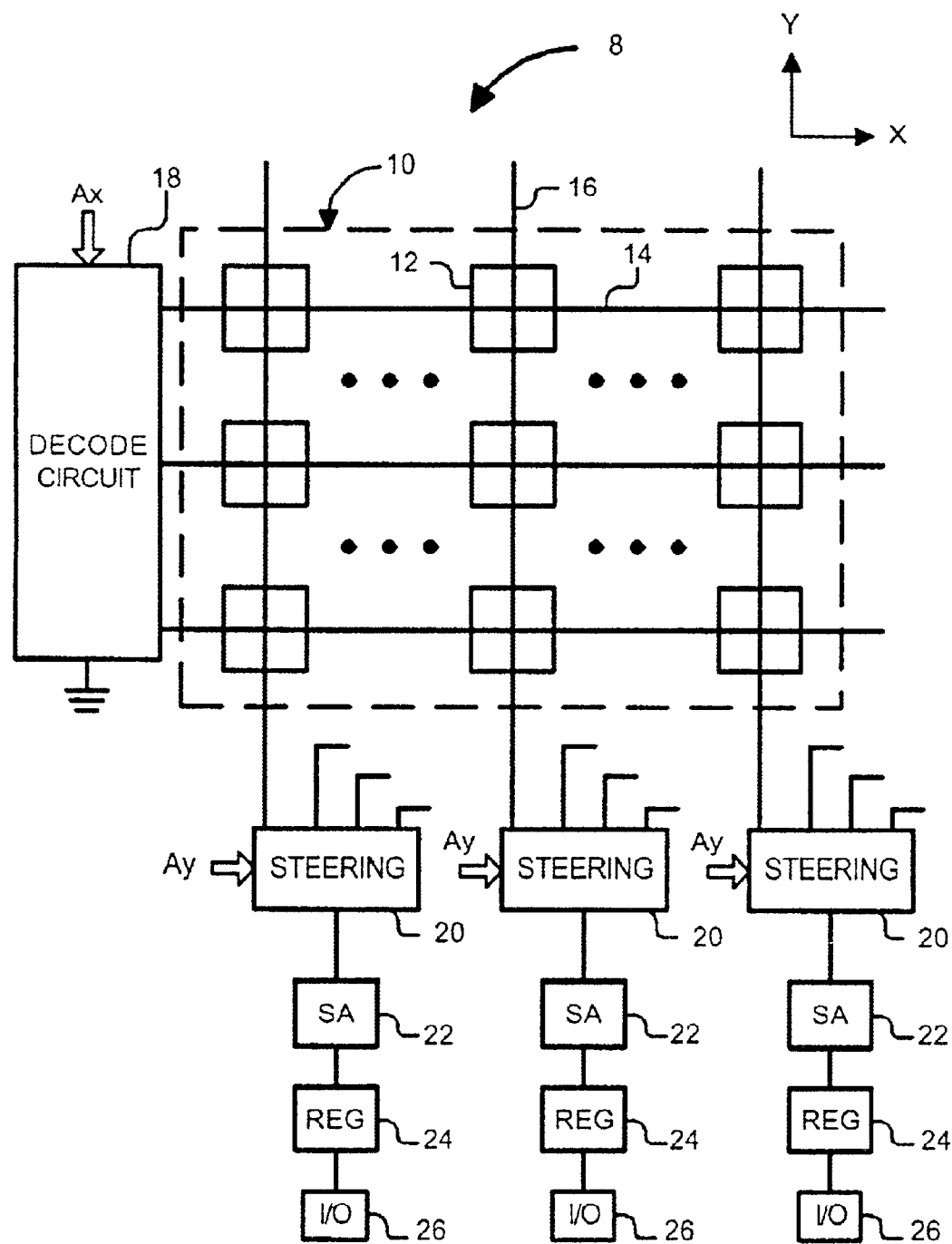
FIG. 1 is an illustration of an MRAM device according to the present invention.

As shown in the drawings for purposes of illustration, the present invention is embodied in an MRAM device. The MRAM device includes an array of SDT junction memory cells whose bottom ferromagnetic layers are ion etched. Ion etching the bottom ferromagnetic layers can increase the usable number of SDT junctions in the MRAM device. The ion etching can reduce ferromagnetic coupling in the SDT junctions, which can reduce the number of SDT junctions having high resistance in a zero magnetic field. The ion etching can also tune the ferromagnetic coupling to improve symmetry of the electrical response loops of the SDT junctions, and it can reduce the number of shorted SDT junctions.

Ion etching the bottom ferromagnetic layers allows tunnel barrier thickness to be reduced. Reducing the thickness of the insulating tunnel barriers of the SDT junctions lowers resistance of the MRAM device, which in turn, reduces power consumption of the MRAM device. Ion etching the bottom electrodes can also increase uniformity of the resistance across the array. Consequently, less complex circuits may be used to sense the magnetization orientations of the SDT junctions.

Reference is now made to FIG. 1, which illustrates an MRAM device 8 including an array 10 of SDT junction memory cells 12. The memory cells 12 are arranged in rows and columns, with the rows extending along an x-direction and the columns extending along a y-direction. Only a relatively small number of memory cells 12 are shown to simplify the description of the invention. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a word line 14 and bit line 16.

The MRAM device 8 also includes a row decoder 18 for selecting word lines 14 during read and write operations. A word line 14 may be selected during a read operation by connecting that word line 14 to ground The MRAM device 8 also includes a steering circuit 20 and a read/write circuit 22 for each group (e.g., sixteen) of columns. The read/write 22 circuit senses resistance of selected memory cells 12 during read operations and it orients the magnetization of the selected memory cells 12 during write operations. Each read/write circuit 22 is coupled to a device I/O pad 26 via a register 24.

Figure 2:
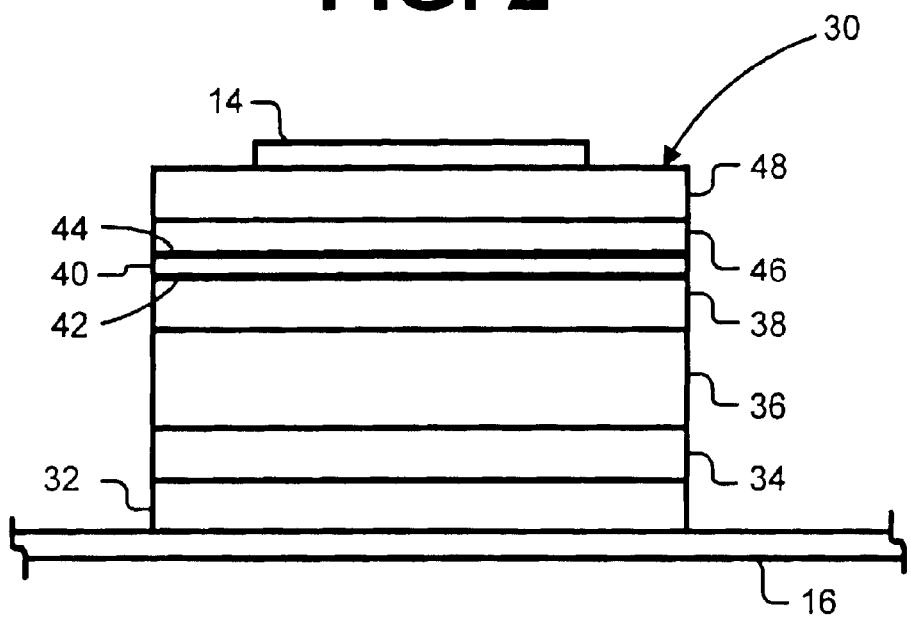
FIG. 2 is an illustration of an MRAM memory cell including an SDT junction, the SDT junction having and top and bottom ferromagnetic layers.

FIG. 2 shows a memory cell in greater detail. An SDT junction 30 is formed between a word line 14 and a bit line 16. FIG. 2 shows the bit line 16 at the bottom of the SDT junction 30 and the word line 14 at the top of the SDT junction 30.

The SDT junction 30 includes a multi-layer stack of materials. The stack includes first and second seed layers 32 and 34. The first seed layer 32 allows the second layer 34 to be grown with a (111) crystal structure orientation. The second seed layer 34 establishes a (111) crystal structure orientation for a subsequent antiferromagnetic ("AF") pinning layer 36. The AF pinning layer 36 provides a large exchange field, which holds the magnetization of a subsequent pinned (bottom) ferromagnetic ("FM") layer 38 in one direction. Atop the pinned FM layer 38 is an insulating tunnel barrier 40. Optional interfacial layers 42 and 44 may sandwich the insulating tunnel barrier 40. Atop the insulating tunnel barrier 40 is a sense (top) FM layer 46 having a magnetization that is free to rotate in the presence of an applied magnetic field. A protective capping layer 48 is atop the sense FM layer 46. A protective dielectric (not shown) covers the stack, and the word line makes electrical contact with protective capping layer 48.

The bit and word lines 14 and 16 may be made of conductive materials such as copper, aluminum or gold or alloys thereof. The first seed layer 32 and the protective capping layer 48 may be made of titanium (Ti) or tantalum (Ta), and the second seed layer 34 may be made of nickel-iron (NiFe). The AF pinning layer 36 may be made of manganese-iron (MnFe), nickel manganese (NiMn), nickel oxide (NiO) or iridium-manganese (IrMn). The FM layers 38 and 46 may be made of NiFe, or iron oxide ($Fe_3O_4$), or chromium oxide ($CrO_2$) or cobalt alloys (e.g., CoFe), or other ferromagnetic or ferrimagnetic materials. The interfacial layers 42 and 44 may be made of iron (Fe). Other materials may be used for the interfacial layers 42 and 44, although a high spin polarized material is desirable. The insulating tunnel barrier 40 may be made of aluminum oxide ($Al_2O_3$), silicon dioxide ($SiO_2$), tantalum oxide ($Ta_2O_5$) or silicon nitride ($SiN_4$). Other dielectrics and certain semiconducting materials may be used for the insulating tunnel barrier 40.

Other configurations may be used in an SDT junction. For example, a hard magnet or a synthetic antiferromagnet may be used instead of an AF pinning layer. The AF pinning layer may be placed near the top of the stack instead of the bottom of the stack, whereby the top FM layer is the pinned layer and the bottom FM layer is the sense layer.

FIGS. 3a and 3b illustrate "parallel" and "anti-parallel" magnetization orientations of the SDT junction 30. The pinned layer 38 has a magnetization that is oriented in a plane, but fixed so as not to rotate in the presence of an applied magnetic field in a range of interest. The sense layer 46 has a magnetization orientation that is not pinned. Rather, the magnetization can be oriented in either of two directions along an axis (the "easy" axis) lying in a plane. If the magnetization of the pinned and sense layers 38 and 46 are in the same direction, the orientation is parallel (as indicated by the arrows in FIG. 3a). If the magnetization of the pinned and sense layers 38 and 46 are in opposite directions, the orientation is anti-parallel (as indicated by the arrows in FIG. 3b).

The insulating tunnel barrier 40 allows quantum mechanical tunneling to occur between the pinned and sense layers 38 and 46. This tunneling phenomenon is electron spin dependent, making the resistance of the SDT junction 30 a function of the relative orientations of the magnetization of the free and pinned layers.

For instance, resistance of an SDT junction 30 is a first value R if the magnetization orientation of the pinned and sense layers 38 and 46 is parallel. Resistance of the memory cell 12 is increased to a second value R+$\Delta$R if the magnetization orientation is changed from parallel to anti-parallel. A typical resistance R may be about one megaohms. A typical change in resistance $\Delta$R may about 30% to 40% of the resistance R.

Data is stored in a memory cell 12 by orienting the magnetization along the easy axis of the sense layer 46. A logic value of "0" may be stored in the memory cell 12 by orienting the magnetization of the sense layer 46 such that the magnetization orientation is parallel, and a logic value of "1" may be stored in the memory cell 12 by orienting the magnetization of the sense layer 46 such that the magnetization orientation is anti-parallel.

Figure 4:
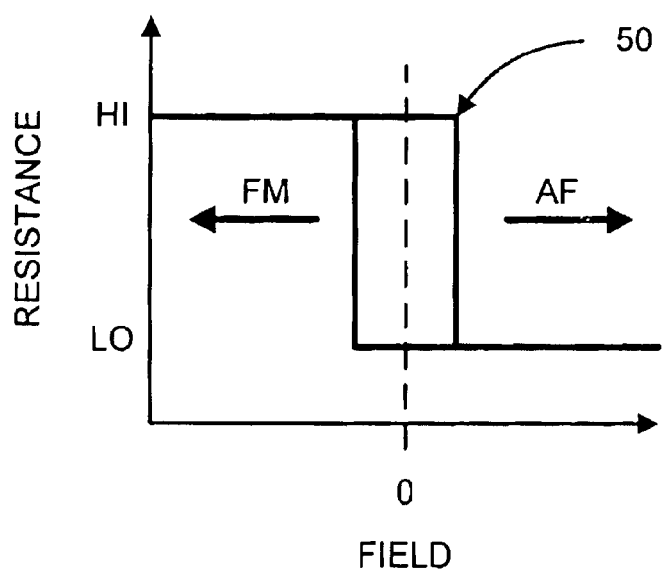
FIG. 4 is an illustration of a desired electrical response loop for the SDT junction.

Ideally, the magnetic fields for switching the SDT junction 30 between parallel and anti-parallel orientations is equal in magnitude. For this to occur the electrical response loop of the sense layer 46 should be centered around a zero magnetic field. Equivalently, the electrical response to a magnetic field at fields below the exchange field should exhibit a loop centered about the zero field. FIG. 4 shows a desired electrical response loop 50 for an SDT junction 30.

During fabrication of the SDT junction 30, the upper surface of the bottom FM layer 38 is ion etched prior to deposition of the insulating tunnel barrier 40 and any bottom interfacial layer 42. The ion etching decreases edge grain angles on the upper surface of the bottom FM layer 38. Shallower angles of the grains are believed to produce fewer magnetic poles at the edges. Ideally, the angle θ from the top of a grain to the intersection with an adjacent grain is between about three and six degrees (see FIG. 5).

Ion etching also smoothes or flattens the upper surface of the bottom FM layer 38. Flattening the upper surface of the bottom FM layer 38 has the effect of reducing the peak-to-valley difference in height. Area between grains is also flattened.

One benefit of flattening the upper surface is that FM coupling is reduced. During deposition of the bottom FM layer 38, the bottom FM layer 38 exhibits columnar growth, which causes the grains to bow upward at the upper surface of the bottom FM layer 38 without large angle slope. This bowing produces magnetic poles on the edges of the FM layer 38. These poles produce a magnetic field in the top FM layer 46 in the same direction as the magnetization of the bottom FM layer 38. Consequently, the bowing causes a strong FM coupling between the bottom and top FM layers 38 and 46. The net result of this coupling is to shift the electrical response loop 50 to the left (as indicated by the arrow FM in FIG. 4). Resulting is an offset of the center of the loop 50 toward negative fields, such that the resistance at zero field is a low resistance state. Reducing the bowing, however, causes the electric response loop 50 to shift back towards center.

Flattening the upper surface to a critical flatness has been found to significantly reduce or eliminate FM coupling. It has been found that a critical flatness is achieved when the peak-to-valley height difference is no more than about one nm. However, ion etching beyond the critical flatness has been found to increase the FM coupling.

Instead of eliminating the FM coupling, the level of FM coupling may be tuned to reduce or cancel AF coupling. Demagnetization fields emanate from the edges of the bottom FM layer. Since this magnetic field tries to complete a circuit, it terminates on the top FM layer and thereby produces a field in the opposite direction of the pinned magnetization This induced field, which is largest at the edges of the top layer, causes antiferromagnetic coupling. The AF coupling tends to move the electrical response loop 50 towards the right (indicated by the arrow AF in FIG. 4), such that the resistance of the junction at zero field is a high resistance state. As the device size gets smaller, the fraction of the sense layer affected by the induced field is greater and thus the AF coupling increases as device size decreases.

The FM coupling can be reduced monotonically with ion etch time. Thus, the ion etch time can be adjusted to allow the FM coupling to exactly compensate for the AF coupling, no matter what device size is used at the design center of the application. This permits adjustment of the magnetic interactions such that the electrical response loop is centered about zero field. Tuning the FM coupling becomes especially valuable as the device becomes smaller and the AF coupling becomes more prominent. Thus, FM coupling may be used advantageously to reduce the AF coupling and center the electrical response loop.

Flattening the upper surface of the bottom FM layer 38 can also improve the uniformity of SDT junction resistance across the device 8. Because the junction resistance is exponentially dependent on the barrier thickness, and because bowing causes variations in the barrier thickness, the bowing also causes variations in resistance from junction 30 to junction 30. When an alumina barrier 40 is being deposited by a process such plasma oxidation, Al is deposited and fills in between the grains, and then on top of the grains. Consequently, the thickness of the insulating tunnel barrier 40 in the valleys is greater than at the peaks. Thus much of the tunneling current comes from the peak areas. Flattening the peaks reduces the peak-to-valley height differences, which improves uniformity of the device resistance. Junction resistance has been found to vary by no more than about 4%.

Flattening the upper surface of the bottom FM layer 38 results in the insulating tunnel barrier 40 being distributed more evenly over the bottom FM layer 38. Because the barrier material is distributed more homogeneously on a flattened surface, the thickness of the insulating tunnel barrier 40 can be reduced without creating pinholes (the pinholes greatly increase magnetic coupling and short the junctions).

Additionally, resistance of the SDT junction 30 is reduced. Reducing the resistance of the junctions can reduce power consumption of the MRAM device.

Flattening the upper surface of the bottom FM layer 38 can also reduce the number of shorted SDT junctions. Extreme variations in barrier thickness, or equivalently in grain peak height, can cause shorting of the SDT junctions 30. Thus, reducing the height of the largest protrusions can reduce the chances of shorting the SDT junctions 30.

Moreover, the above mentioned benefits described in reference to flattening the upper surface of the bottom FM layer 38 can also be obtained by flattening the upper surface of the AF pinning layer 36. Prior to depositing the bottom FM layer 38, ion etching can be used to smooth or flatten the upper surface of the AF pinning layer 36. Flattening the AF pinning layer 36 reduces peak-to-valley differences in height on the upper surface of the AF pinning layer 36. Consequently, the bottom FM layer 38 is deposited on a substantially flat surface. Resulting is a reduction in the columnar growth and the magnetic poles at the edges of the FM layer 38. In summary, the above mentioned benefits can be obtained by flattening the upper surface of the bottom FM layer 38, flattening the upper surface of the AF pinning layer 36, or by flattening the upper surfaces of both the AF pinning layer 36 and the bottom FM layer 38.

FIG. 5 is an illustration of peak-to-valley height difference on the upper surface of the bottom FM layer 38. A flattened peak is indicated in solid lines by numeral 52, and a portion of the peak removed by ion etching is indicated in dashed lines. A valley is indicated by numeral 54. The height difference between a flattened peak 52 and a valley 54 is indicated by the letter X. FIG. 5 is intended merely to illustrate the peak-valley height difference that results from ion etching. It is not intended to provide an accurate depiction of the upper surface of the bottom FM layer 38. Although not illustrated in FIG. 5, similar peak-to-valley height differences apply to the upper surface of the AF pinning layer 36.

Figure 6:
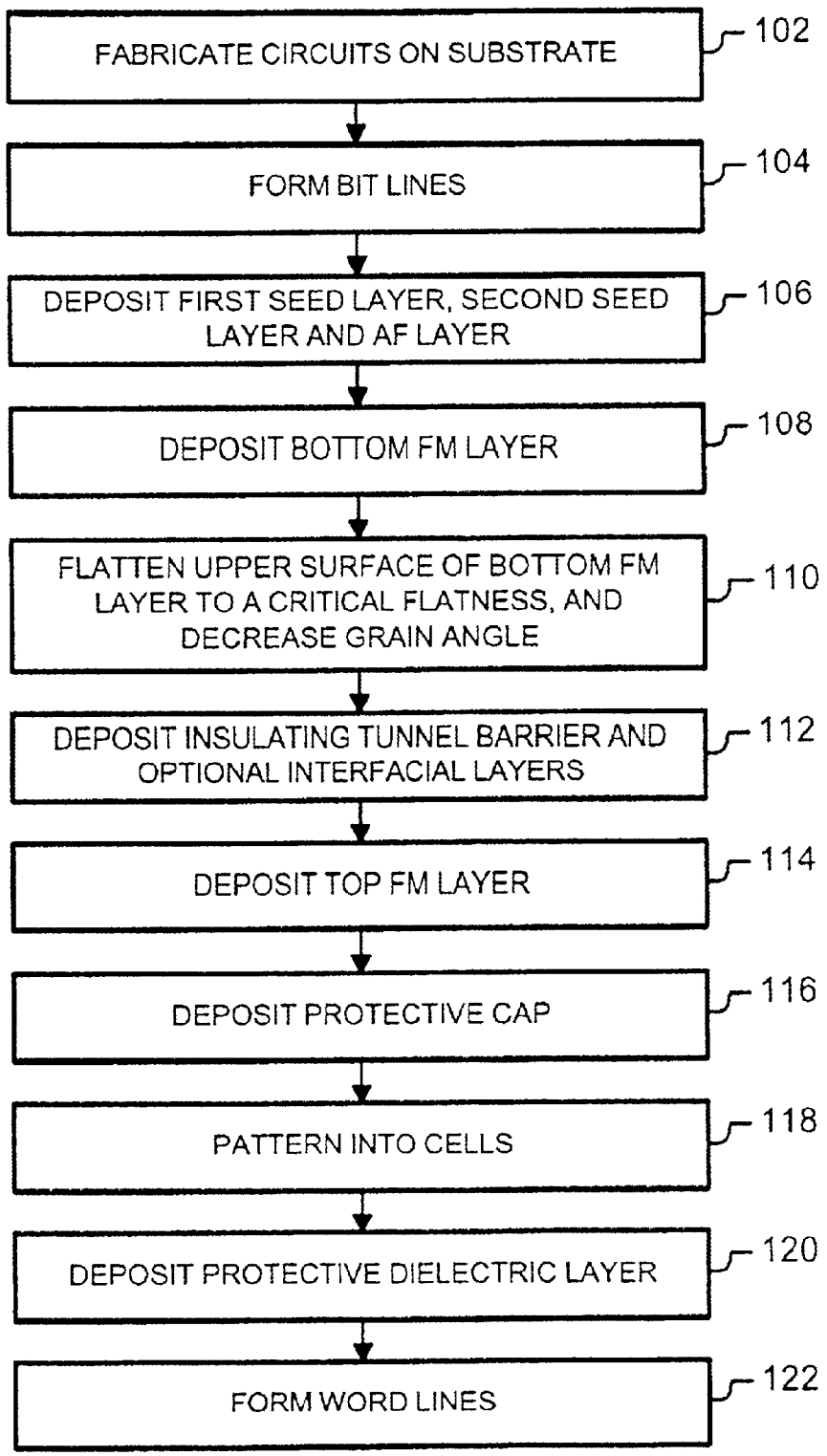
FIG. 6 is an illustration of a method of fabricating the MRAM device according to the present invention.

FIG. 6 shows a method of manufacturing the MRAM device 8. Read/write circuits, row decoders and other circuits are fabricated on a substrate (block 102). Conductor material is then deposited onto the substrate and patterned into bit lines (block 104). A dielectric may then be deposited between the bit lines. The first seed layer, the second seed layer and the AF layer are deposited in seriatim (block 106).

The bottom FM layer is deposited over the AF layer (block 108). During deposition of the material for the bottom FM layer, the FM layer exhibits columnar growth. The thickness of the deposited pinned FM layer is increased to compensate for the ion etching that will follow The upper, exposed surface of the bottom FM layer is flattened to a critical flatness by a process such as ion etching (block 110). Additionally, grain angles are rounded during the flattening (block 110). The ion etching may be performed by bombarding the bottom FM layer with argon ions or any other non-reactive ions.

An optional bottom interfacial layer may then be deposited, followed by the insulating tunnel barrier (block 112). A barrier material such as $Al_2O_3$, for example, may be deposited by r-f sputtering, or by depositing aluminum and then oxidizing the aluminum by a process such as plasma oxidation. An optional top interfacial layer may be deposited on the insulating tunnel barrier (block 112).

The top FM layer is then deposited (block 114). The protective capping layer is deposited on the upper FM layer (block 116).

The resulting stack is then patterned into cells (block 118). Patterning may be performed by depositing a layer of photo-resist on the protective capping layer, using photolithography to pattern the photo-resist, and using ion milling to remove material not protected by the photo-resist. This ion milling may be stopped at the AF layer or the bottom FM layer. Resulting is a common AF layer that will be shared by multiple SDT junctions. If the ion milling is stopped at the bottom FM layer, the SDT junctions will also share a common bottom FM layer. Vias may also be milled in order to establish connections with the underlying circuitry.

A thin layer of dielectric is then formed on the patterned structures (block 120). The dielectric, which fills in spaces between the patterned structures, prevents short circuits between edges of magnetic films. It also prevents conductors from shorting. Openings for word line connections are then formed in the dielectric. Conductor material is then deposited on the dielectric and patterned into word lines (block 122).

The resulting array may then be planarized. A new array may be formed atop the planarized array.

These blocks 102 to 122 describe the manufacture of a single MRAM device. In practice, however, many MRAM devices will be fabricated simultaneously on a single wafer.

A first sample of an SDT junction was fabricated on a wafer by a conventional method, and second and third samples were fabricated on wafers by the method described above. The wafer for the first (conventional) sample was cleaned by ion etching it for 10 minutes. A 5 nm first seed layer of Ta was deposited on the cleaned wafer, followed by a 6 nm second seed layer of NiFe, a 10 nm AF layer of MnFe, a 4 nm bottom FM layer of NiFe, an $Al_2O_3$ insulating tunnel barrier, a 4 nm top FM layer of NiFe, and a 5 nm protective capping layer of Ta. The insulating tunnel barrier was formed by depositing a 1.25 nm layer of aluminum and then oxidizing the deposited aluminum by plasma oxidation for 2:30. Junction size of all three samples was 0.75 microns×1.5 microns.

The only difference between the first and second samples was that the bottom FM layer of the second sample had an initial thickness of 8 nm, but was ion etched for 5 minutes at a rate of 0.8 nm/min and thereby reduced to 4 nm. The only difference between the second and third samples was the thickness of the insulating tunnel barrier. In the second sample, a 1.25 nm layer of aluminum was deposited and then oxidized by plasma oxidation for 2:30. In the third sample, a 1.0 nm layer of aluminum was deposited and then oxidized by plasma oxidation for 1:30.

Morphologies of witness wafers for the three samples were measured directly by Atomic Force Microscopy (AFM). The witness wafer for the first (conventional) sample indicated that the bottom FM layer of the first sample had deep valleys and high peaks in the columnar grain structure, Measurements of peak to valley height were on the order of 15 Angstroms. The edges of the grains tended to be very sharp.

The witness wafers for the second and third samples indicated that the peaks of the bottom FM layers were much more rounded, with a larger radius of curvature. The areas between the grains were relatively flat. The measured peak-to-valley distance was a maximum of about 9 Angstroms. The larger radius of curvature also produced shallower angles of the grains.

The witness wafers for the second and third samples revealed that thickness of the insulating tunnel barrier can be reduced without creating pinholes. The thinner barrier of the third sample did not have pinholes. Reducing the thickness of the barrier also reduced junction resistance from about 46.6 $K\Omega\text{-}\mu m^2$ to about 10 $K\Omega\text{-}\mu m^2$ and even lower.

Reference is now made to FIG. 7, which illustrates a multi-level MRAM chip 200. The MRAM chip 200 includes a number Z of memory cell levels or planes 202 that are stacked in a z-direction on a substrate 204. The number Z is a positive integer where $Z \geq 1$. The memory cell levels 202 may be separated by insulating material (not shown) such as silicon dioxide. Read and write circuits may be fabricated on the substrate 204. The read and write circuits may include additional multiplexers for selecting the levels that are read from and written to.

The invention is not limited to the specific embodiments described and illustrated above. For instance, an etching process other than ion etching may be used. The bottom FM layer may be formed as the sense layer and the top FM layer may be formed as the pinned layer. During fabrication, the upper surface of the bottom layer would still be flattened. Thus, whether the bottom layer is a sense layer or a pinned layer, it has the flattened upper surface.

The method described above is not limited to MRAM devices. The method described above may be used to smooth interfaces in GMR devices. For example, the method may be used to smooth interfaces in GMR read heads. The method may also be used to smooth interfaces in artificial antiferromagnets.

Therefore, the present invention is not limited to the specific embodiments described and illustrated above. Instead, the present invention is construed according to the claims that follow.

What is claimed is:

1. An SDT junction of a memory cell for an MRAM device, the junction comprising:
   a bottom ferromagnetic layer, the bottom ferromagnetic layer having flattened peaks;
   an insulating tunnel barrier atop the bottom ferromagnetic layer; and
   a top ferromagnetic layer atop the insulating tunnel barrier.

2. The junction of claim 1, wherein the flattened peaks have a valley-to-peak height difference of no more than about one nanometer.

3. The junction of claim 1, wherein the junction has a resistance of less than about 10 $K\Omega\text{-}\mu m^2$.

4. The junction of claim 1, wherein the top and bottom layers are AF coupled; wherein the flattened peaks tune the AF coupling to a desired level.

5. An MRAM device comprising:

an array of memory cells, each memory cell including an SDT junction, each SDT junction including a bottom ferromagnetic layer, each bottom ferromagnetic layer having an upper surface, each upper surface having a valley-to-peak height variation of no more than about one nanometer;

a plurality of word lines extending along memory cell rows of the array; and a plurality of bit lines extending along memory cell columns of the array.

6. The device of claim 5, wherein resistance variation of the junctions across the entire array is no more than about 4%.

7. The device of claim 5, wherein the junctions have a resistance of less than about 10 K$\Omega$-$\mu$m$^2$.

* * * * *